(12) United States Patent
Wakiya et al.

(10) Patent No.: US 7,291,393 B2
(45) Date of Patent: Nov. 6, 2007

(54) COATED CONDUCTIVE PARTICLE COATED CONDUCTIVE PARTICLE MANUFACTURING METHOD ANISOTROPIC CONDUCTIVE MATERIAL AND CONDUCTIVE CONNECTION STRUCTURE

(75) Inventors: Takeshi Wakiya, Osaka (JP); Yoshikazu Yoneda, Shiga (JP); Masako Ueba, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 102 days.

(21) Appl. No.: 10/489,406

(22) PCT Filed: Sep. 17, 2002

(86) PCT No.: PCT/JP02/09490

§ 371 (c)(1),
(2), (4) Date: Jul. 30, 2005

(87) PCT Pub. No.: WO03/025955

PCT Pub. Date: Mar. 27, 2003

(65) Prior Publication Data

US 2006/0154070 A1    Jul. 13, 2006

(30) Foreign Application Priority Data

Sep. 14, 2001  (JP) .............................. 2001-280005
Oct. 23, 2001  (JP) .............................. 2001-325311
Jun. 18, 2002  (JP) .............................. 2002-177358

(51) Int. Cl.
*B32B 5/16*    (2006.01)
*B05D 7/00*    (2006.01)

(52) U.S. Cl. ...................... 428/403; 427/216; 427/220; 427/221; 428/407

(58) Field of Classification Search ............... 428/403, 428/407; 427/212, 216, 220, 221
See application file for complete search history.

(56) References Cited

U.S. PATENT DOCUMENTS

| 4,834,928 | A | * | 5/1989 | Su ............................. 264/651 |
| 5,923,945 | A | * | 7/1999 | Eisman et al. ............. 428/552 |
| 6,344,156 | B1 | * | 2/2002 | Yamada et al. ............ 252/512 |
| 6,592,783 | B2 | * | 7/2003 | Kumakura et al. ......... 252/500 |
| 7,134,879 | B2 | * | 11/2006 | Sugimoto et al. ............. 439/66 |

FOREIGN PATENT DOCUMENTS

| EP | 0 647 477 A1 | 4/1995 |
| EP | 647477 A1 | 4/1995 |
| EP | 1 107 298 A3 | 6/2001 |
| EP | 1107298 A2 | 6/2001 |
| JP | 3-112011 A | 5/1991 |
| JP | 4-259766 A | 9/1992 |

(Continued)

*Primary Examiner*—H. T Le
(74) *Attorney, Agent, or Firm*—Sughrue Mion, PLLC

(57) ABSTRACT

An objective of the invention is to provide a coated conductive particle having superior connection reliability, a method for manufacturing such coated conductive particle, an anisotropic conductive material and a conductive-connection structure.

Figure 1:
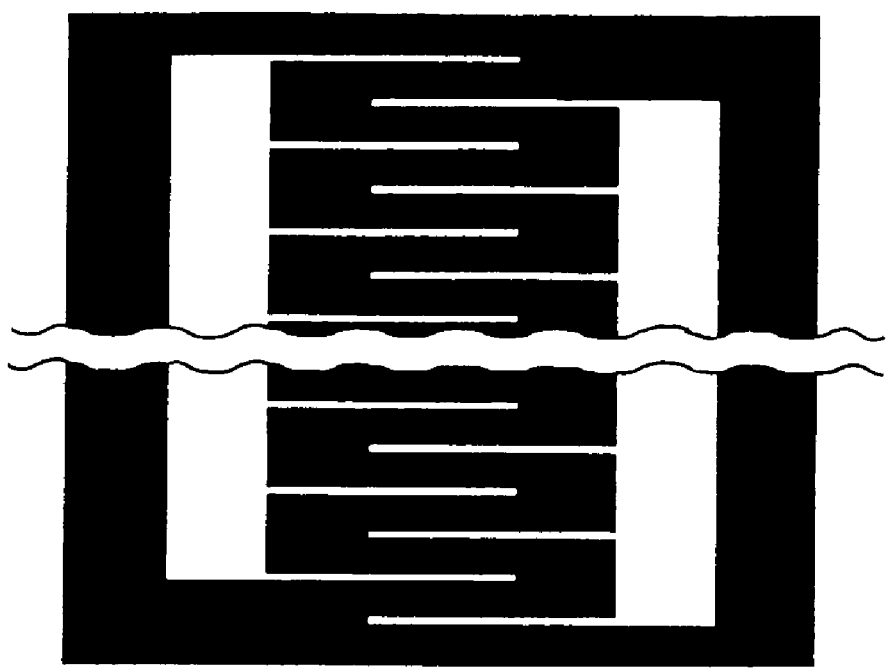

A coated conductive particle comprising a particle having a surface made of conductive metal and an insulating particles to coat the surface of the particle having the surface made of conductive metal there with, wherein the insulating particles are chemically bonded to the particle having the surface made of conductive metal via a functional group (A) having a bonding property to the conductive metal so that a single coating layer is formed.

20 Claims, 1 Drawing Sheet

FOREIGN PATENT DOCUMENTS

| | | | |
|---|---|---|---|
| JP | 4-362104 A | 12/1992 |
| JP | 06-059268 | * 3/1994 |
| JP | 7-105716 A | 4/1995 |
| JP | 8-325543 A | 12/1996 |
| JP | 2002-329945 A | 11/2002 |
| JP | 62-40183 A | 2/2004 |

* cited by examiner

COATED CONDUCTIVE PARTICLE COATED CONDUCTIVE PARTICLE MANUFACTURING METHOD ANISOTROPIC CONDUCTIVE MATERIAL AND CONDUCTIVE CONNECTION STRUCTURE

TECHNICAL FIELD

The present invention relates to a coated conductive particle having superior connection reliability, a method for manufacturing such coated conductive particle, an anisotropic conductive material and a conductive-connection structure.

BACKGROUND ART

Particles, each having a metal surface, have been used as various resin fillers, modifying agents and the like, and in addition to these usages, those particles are mixed in a binder resin as conductive particles, and used as so-called anisotropic conductive materials that electrically connect miniature-size electrical parts such as semiconductor elements to circuit boards, or electrically connect circuit boards to each other, in electronic products such as liquid crystal displays, personal computers and portable communication devices.

In recent years, along with the developments of miniature-size electronic apparatuses and electronic parts, wires on circuit boards and the like have become finer, and under these circumstances, conductive particles have been made further finer, and the precision of particle sizes has been improved. In order to ensure high connection reliability, it is necessary to increase the blended amount of conductive particles in an anisotropic conductive material, and in the case of a circuit board and the like having such fine wires, conduction or the like in a lateral direction may occur between adjacent conductive particles to cause problems of short circuit and the like between adjacent electrodes. In order to solve these problems, an anisotropic conductive material, which uses conductive particles of which surfaces are coated with an electrical insulating material, has been proposed.

With respect to the method for coating the surfaces of conductive particles with an electrical insulating material, for example, Japanese Kokai Publication Hei-4-362104 has disclosed a method in which an interface polymerizing process, a suspension polymerizing process, an emulsion polymerizing process or the like is carried out in the presence of conductive particles so that the particles are encapsulated in an electrical insulating resin, Japanese Kokai Publication Sho-62-40183 has disclosed a method for forming microcapsules with an electrical insulating resin by a dipping process in which conductive particles have been dispersed in the resin solution, and then dried, and Japanese Kokai Publication Hei-7-105716 has disclosed methods in which a hybridization process are used for this purpose; and in addition to these methods, methods using vacuum vapor deposition and the like have been known.

In these methods, however, it is difficult to form an insulating coating layer with a constant thickness, and in some cases, a plurality of conductive particles are simultaneously coated. In the case where conductive connection is made by using coated conductive particles, if the thickness of the insulating coating layer is not uniform, a pressure is not transmitted uniformly upon fixing the layer between electrodes even when the particle size of the conductive particles is precisely controlled, with the result that a defective conduction may occur. For example, in the case of the above-mentioned formation method of the insulating coat by the hybridization process, since insulating resin particles to form a coating layer are made to adhere to the surfaces of the conductive particles by a physical force in this method, it is not possible to form the coating layer on the surface of each of the conductive particles as a single layer, with the result that it becomes difficult to control the thickness of the insulating coating layer, and since the resin particles are fused and deformed due to heat and impact caused by the heating process and frictional heat, it is difficult to prepare an uniform coating layer. Moreover, since the contact area between the insulating resin particles and the metal surface becomes greater, it is difficult to remove the insulating coating layer in the case where a device to which it is difficult to apply heat and pressure, such as a liquid crystal element, is used, with the result that a defective conduction may occur.

Japanese Kokai Publication Hei-4-259766 and Japanese Kokai Publication Hei-3-112011 have disclosed coated conductive particles in which insulating particles are adhered weakly to the surfaces of conductive particles by an electrostatic interaction and a hybridization method. However, in the coated conductive particles obtained by these methods, since a bonding force between the insulating particles and the conductive particles, which is dependent only on Van der Waals force or electrostatic force, is very weak, insulating particles are separated from the conductive particles by dispersion in a binder resin and contact between adjacent particles. As a result, failing to ensure a sufficient insulating property occur.

Moreover, conventionally, upon forming an anisotropic conductive material by dispersing such coated conductive particles in a binder resin, those coated conductive particles having a coating layer that is non-compatible to the binder resin, solvent and the like have been used. For example, Japanese Kokai Publication Hei-4-362104 has disclosed a polymer coating method for metal particles in which a homopolymer layer or a copolymer layer that is non-compatible to a binder resin is formed on the surface of metal particles; Japanese Kokai Publication Sho-62-40183 has disclosed an electrical connecting sheet which is formed by dispersing conductive particles in a hot-melt type insulating adhesive, and is characterized in that the conductive particles are coated with a resin that is non-compatible to the hot-melt type insulating adhesive; and Japanese Kokai Publication Hei-7-105716 has disclosed coated conductive particles each of which is composed of an insulating core material, a conductive layer formed on the core material and an insulating layer that covers 0.1 to 99.9% of the area of the conductive layer.

However, when the conductive particles each of which has a coating layer that is non-compatible to a binder resin are used, affinity in the interface between the binder resin and the coated conductive particles becomes poor, with the result that the coated conductive particles dispersed in the binder resin may cause a phase separation and the like and the resulting poor connecting stability. In particular, in the case of an anisotropic conductive film and an anisotropic conductive adhesives using thermosetting resin as a binder resin, since the affinity in the interface between the binder resin and the coated conductive particles is poor, a separation occurs in the interface between the binder resin and the coated conductive particles after the binder resin has been cured by thermocompression bonding, failing to ensure long-term stability and reliability in connection. Moreover, in the case where coated conductive particles are dispersed in the binder resin such as a sealing agent or the like in order to maintain a gap between the electrodes as well as between liquid crystal panels, since the resin used for forming the coating layer is non-compatible to the binder resin, there is a problem that coated resin thermally fused may bleed out to pollute electrodes, liquid crystal and the like.

SUMMARY OF THE INVENTION

An objective of the present invention is to provide a coated conductive particle having superior connection reliability, a method for manufacturing a coated conductive particle, an anisotropic conductive material and a conductive-connection structure.

A first aspect of the present invention relates to a coated conductive particle comprising a particle having a surface made of conductive metal and an insulating particles to coat the surface of the particle having the surface made of conductive metal there with, wherein the insulating particles are chemically bonded to the particle having the surface made of conductive metal via a functional group (A) having a bonding property to the conductive metal so that a single coating layer is formed. The particle having the surface made of conductive metal preferably comprises a core particle made from a resin and a conductive metal layer formed on the surface of the core particle. The above-mentioned insulating particles preferably have an average particle size of not more than $1/10$ of the average particle size of the particle having the surface made of conductive metal and also have a CV value of the particle size of not more than 20%, and are preferably brought into contact with the surface of the particle having the surface made of conductive metal at not more than 20% of the surface area. Moreover, the above-mentioned insulating particles may be softer than the particle having the surface made of conductive metal, and in this case, the particles may be made from a crosslinking resin. Here, the above-mentioned insulating particles may be harder than the particle having the surface made of conductive metal. Moreover, the above-mentioned insulating particles preferably have a positive charge, and are preferably made from a resin having an ammonium group or a sulfonium group. The functional group (A) having a bonding property to metal is preferably a thiol group or a sulfide group.

In another aspect of the present invention, a method for manufacturing the coated conductive particle of the first aspect of the present invention is provided with at least a step 1 of allowing insulating particles to aggregate onto the particle having the surface made of conductive metal by a Van der Waals force or an electrostatic force in an organic solvent and/or water, and a step 2 of chemically bonding the particle having the surface made of conductive metal and the insulating particles to each other.

A second aspect of the present invention relates to an anisotropic conductive material in which the coated conductive particle of the first aspect of the present invention is dispersed in an insulating binder resin. The binder resin is preferably an adhesive being cured by heat and/or light. Further, the functional group belonging to the insulating particles of the coated conductive particle is preferably chemically bonded to the functional group in the binder resin, and in this case, the functional group belonging to the insulating particles of the coated conductive particles to be chemically bonded to the functional group in the binder resin is preferably an epoxy group. The above-mentioned anisotropic conductive material is preferably an anisotropic conductive adhesive.

A third aspect of the present invention relates to a conductive-connection structure which is conduction-connected by the coated conductive particle of the first aspect or the anisotropic conductive material of the second aspect.

BRIEF DESCRIPTION OF THE DRAWING(S)

FIG. 1 is a schematic drawing that shows a silicon wafer circuit board having a comb-shaped pattern, which is used in an example.

DETAILED DISCLOSURE OF THE INVENTION

The following description will discuss the present invention in detail.

In accordance with the first aspect of the present invention, each of the coated conductive particles comprise particles each having a surface made of conductive metal (hereinafter, referred to as metal surface particles), and insulating particles with which the surface of the particle having the surface made of conductive metal is coated. With this arrangement in which the surface of each metal surface particle is coated with the insulating particles, even in the case where, upon circuit boards and the like by using the coated conductive particles of the first aspect of the present invention, the circuit boards and the like have fine wires, it is possible to prevent conduction and the like in the lateral direction from occurring by adjacent conductive particles, and in the longitudinal direction, the metal surface of the metal surface particle is exposed by carrying out a thermocompression bonding process by application of heat and pressure so as to positively make conduction.

With respect to the above-mentioned metal surface particles, not particularly limited as long as the outermost surface thereof is made of conductive metal, examples thereof include: particles made of only metal; particles in which a metal layer is formed on the surface of each of core particles made from an organic compound or an inorganic compound, by vapor deposition, plating, coating or the like; and particles in which metal particles are introduced onto the surface of each of insulating core particles. Among these, with respect to those particles in which a conductive metal layer is formed on the surface of each of core particles made from a resin, when the coated conductive particles of the present invention are used for an anisotropic conductive material, those particles are deformed upon contact-bonding electrodes to each other thereby to increase the contact area, so that they are preferably used from the viewpoint of connection stability.

With respect to the above-mentioned metal, not particularly limited as long as it has conductivity, examples thereof include: metals such as gold, silver, copper, platinum, zinc, iron, tin, lead, aluminum, cobalt, indium, nickel, chromium, titanium, antimony, bismuth, germanium, cadmium and silicon; and metal compounds such as ITO and solder.

The above-mentioned metal layer may have a single-layer structure or a laminated structure having a plurality of layers. In the case of the laminated structure, the outermost layer is preferably made of gold. By using gold as the outermost layer, it becomes possible to provide high corrosion resistance and small contact resistance, and consequently to achieve superior coated conductive particles.

With respect to the method for forming the conductive metal layer on the surface of each of the core particles made from a resin, although not particularly limited, examples thereof include known methods such as a physical metal vapor deposition method and a chemical electroless plating method, and from the viewpoint of simple processes, the electroless plating method is preferably used. With respect to the metal layer formed by the electroless plating process, for example, gold, silver, copper, platinum, palladium, nickel, rhodium, ruthenium, cobalt, tin and alloys of these and the like are exemplified; and in the coated conductive particles of the present invention, one portion or the entire portion of the metal layer is preferably formed by the electroless nickel plating, since this method makes it possible to form an uniform coating layer with high density.

With respect to the method for forming a gold layer as the outermost layer of the above-mentioned metal layer, not particularly limited, for example, known methods, such as electroless plating, substitution plating, electric plating and sputtering, are used.

With respect to the thickness of the metal layer, although not particularly limited, the lower limit value is preferably set to 0.005 μm, and the upper limit value is preferably set to 1 μm. In the case of the thickness of less than 0.005 μm, it sometimes becomes difficult to obtain sufficient effects as the conductive layer, and in the case of the thickness of more than 1am, the specific gravity of the resulting coated conductive particles becomes too high, or the hardness of the core particles made from a resin becomes too high to be sufficiently deformed. The lower limit value is more preferably set to 0.01 μm, and the upper limit value is more preferably set to 0.3 μm.

Moreover, in the case where a gold layer is used as the outermost layer of the above-mentioned metal layer, the lower limit of the thickness of the gold layer is preferably set to 0.001 μm, and the upper limit thereof is preferably set to less than 0.5 μm. In the case of the thickness of less than 0.00 μm, it becomes difficult to coat the metal layer uniformly, with the result that the improved effects in corrosion resistance and contact resistance value are no longer achieved, and in the case of the thickness of more than 0.5 μm, the layer becomes expensive in comparison with its effects. The lower limit value is more preferably set to 0.01 μm, and the upper limit value is more preferably set to 0.1 μm.

In the case where each of the metal surface particles comprise a core particle made from an organic compound and a metal layer formed on the surface thereof, not particularly limited, the core particles are made from, for example, polyolefins such as polyethylene, polypropylene, polystyrene, polypropylene, polyisobutylene and polybutadiene, acrylic resins such as polymethylmethacrylate and polymethylacrylate, polyalkylene terephthalate, polysulfone, polycarbonate, polyamide, phenolic resins such as phenol formaldehyde resin, melamine resins such as melamine formaldehyde resin, benzoguanamine resins such as benzoguanamine formaldehyde resin, urea formaldehyde resin, epoxy resins, (un)saturated polyester resins, polyethylene terephthalate, polysulfone, polyphenylene oxide, polyacetal, polyimide, polyamidimide, polyetherether ketone, polyether sulfone, and the like. Among these, those core particles, which are made from a resin formed by polymerizing one kind or two kinds or more of various polymerizable monomers having an ethylenic unsaturated group, are preferably used since they easily provide a preferable hardness.

The polymerizable monomer having an ethylenic unsaturated group may be a non-crosslinking monomer or a crosslinking monomer.

With respect to the non-crosslinking monomer, examples thereof include: styrene-based monomers, such as styrene, α-methylstyrene, p-methylstyrene, p-chlorostyrene and chloromethylstyrene; carboxylic-group containing monomers such as (meth)acrylic acid, maleic acid and maleic anhydride; alkyl(meth)acrylates such as methyl(meth)acrylate, ethyl(meth)acrylate, propyl(meth)acrylate, butyl(meth) acrylate, 2-ethylhexyl(meth)acrylate, lauryl(meth)acrylate, cetyl(meth)acrylate, stearyl(meth)acrylate, cyclohexyl (meth)acrylate, isobornyl(meth)acrylate, ethylene glycol (meth)acrylate, trifluoroethyl(meth)acrylate and pentafluoropropyl(meth)acrylate; oxygen-atom-containing (meth) acrylates such as 2-hydroxyethyl(meth)acrylate, glycerol (meth)acrylate, polyoxyethylene(meth)acrylate and glycidyl (meth)acrylate; nitrile-containing monomers such as (meth) acrylonitrile; vinyl ethers such as methyl vinyl ether, ethyl vinyl ether and propyl vinyl ether; acid vinyl esters such as vinyl acetate, vinyl butyrate, vinyl laurate, vinyl stearate, vinyl fluoride, vinyl chloride and vinyl propionate; and unsaturated hydrocarbons such as ethylene, propylene, butylene, methyl pentene, isoprene and butadiene.

With respect to the above-mentioned crosslinking monomers, examples thereof include: multifunctional (meth)acrylates, such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, polyethylene glycol di(meth)acrylate and polypropylene glycol di(meth)acrylate; diallyl ethers such as triallyl (iso)cyanurate, triallyl trimellitate, divinyl benzene, diallyl phthalate and diallyl acrylamide; silane-containing monomers such as γ-(meth)acryloxypropyl trimethoxysilane, trimethoxy silylstyrene and vinyl trimethoxysilane; dicarboxylic acids such as phthalic acid; diamines; diallyl phthalate, benzoguanamine, triallyl isocyanate and the like.

The lower limit of the average particle size of the above-mentioned core particles is preferably set to 0.5 μm, and the upper limit thereof is preferably set to 100 μm. When the average particle size is less than 0.5 μm, aggregation may occur upon forming a metal layer, with the result that the resulting coated conductive particles, manufactured by using the core particles having the aggregation, may cause short-circuiting between adjacent electrodes, and when the average particle size is more than 100 μm, the metal layer of the resulting coated conductive particles is susceptible to separation, resulting in poor connecting reliability. The lower limit is more preferably set to 1am, and the upper limit is more preferably set to 20 μm. Here, the average particle size of the above-mentioned core particles can be found by statistically processing particle sizes measured by using an optical microscope, an electronic microscope, a Coulter Counter and the like.

The variation coefficient of the average particle size of the core particles is preferably set to not more than 10%. The variation coefficient of more than 10% makes it difficult to desirably control the gap between electrodes that face each other by using the resulting coated conductive particles. Here, the term, "variation coefficient", used herein refers to a numeric value obtained by dividing the standard deviation derived from the particle-size distribution by the average particle size.

The lower limit of the 10% K value of the above-mentioned core particles is preferably set to 1000 MPa, and the upper limit thereof is preferably set to 15000 MPa. When the value is less than 1000 MPa, the strength of the resulting coated resin particles becomes insufficient; therefore, when compressed and deformed, the particles may be broken, failing to exert functions as a conductive material. In contrast, when the value is more than 15000 MPa, the electrodes may be damaged. The lower limit is more preferably set to 2000 MPa, and the upper limit is more preferably set to 10000 MPa. Here, the above-mentioned 10% K value is obtained by testing processes in which: a minute compression tester (for example, PCT-200 made by Shimadzu Corporation, and the like) is used, and particles are compressed by the end face of a smooth indenter formed by a column made of diamond with a diameter of 50 μm, under conditions of a compression rate of 2.6 mN/sec and a maximum test load of 10 g so that a compression dislocation (mm) is measured, and the corresponding value is obtained by the following equation:

$$K \text{ value}(N/mm^2) = (3/\sqrt{2}) \cdot F \cdot S^{-3/2} \cdot R^{-1/2}$$

F: load value (N) in 10% compression deformation of particles

S: compression dislocation (mm) in 10% compression deformation of particles

R: radius (mm) of particles

Here, in order to obtain core particles of which 10% K value satisfies the above-mentioned conditions, the core particles are preferably formed by a resin that is prepared by polymerizing the above-mentioned polymerizable monomer having an ethylenic unsaturated group, and in this case, at least not less than 20 weight % of the cross-linking monomer is preferably contained therein as a constituent component.

The core particles are preferably allowed to have a recovery rate of not less than 20%. In the case of the recovery rate of less than 20%, since, upon compressing the resulting coated conductive particles, the deformed particles fail to return to its original state, defective connection may occur. The recovery rate is more preferably set to not less than 40%. Here, the above-mentioned recovery rate refers to a recovery rate obtained after imposing a load of 9.8 mN to the particles.

With respect to the above-mentioned insulating particles, not particularly limited as long as the particles have an insulating property, examples thereof include those particles made from an insulating inorganic substance such as silica, in addition to those particles made from an insulating resin. Among these, those particles made from an insulating resin are preferably used. With respect to the above-mentioned insulating resin, not particularly limited, for example, those resins for use in the above-mentioned core particles may be used. These resins may be used alone, or two or more kinds thereof may be used in combination.

Although varied depending on the particle size of the metal surface particles and the applications of the coated conductive particles, the particle size of the insulating particles is preferably set to not more than 1/10 of the particle size of the metal surface particles. In the case of the particle size of more than 1/10, the particle size of the insulating particles becomes too great, with the result that the effects of the application of the metal surface particles are no longer expected. Moreover, in the case of the particle size of not more than 1/10, upon manufacturing the coated conductive particles of the present invention by a hetero-aggregation method, it is possible to effectively adsorb the insulating particles onto the metal surface particles. Moreover, in the case where the coated conductive particles of the present invention are used as an anisotropic conductive material, the particle size of the insulating particles is preferably set in a range from 5 to 1000 nm. In the case of the particle size of less than 5 nm, since the distance between the adjacent coated conductive particles becomes smaller than a hopping distance of electrons, leaking may occur, and in the case of the particle size of more than 1000 nm, a pressure and heat required upon thermocompression bonding become too great. More preferably, the particle size is set in a range from 10 to 500 nm.

Additionally, two kinds of insulating particles having respectively different particle sizes may be used in combination since this arrangement allows smaller insulating particles to enter gaps formed between greater insulating particles serving as a coating layer to improve the coating density. In this case, the particle size of the smaller insulating particles is preferably set to not more than ½ of the particle size of the larger insulating particles, and the number of the smaller insulating particles is preferably set to not more than ¼ of the number of the larger insulating particles.

The above-mentioned insulating particles are preferably allowed to have a CV value of the particle size of not more than 20%. In the case of the CV value of more than 20%, the thickness of the resulting coating layer of the coated conductive particles becomes nonuniform, with the result that it becomes difficult to apply a pressure uniformly upon conducting thermocompression-bonding processes between electrodes, and the subsequent defective conduction may occur. Here, the CV value of the above-mentioned particle size is calculated from the following equation:

$$CV \text{ value (\%) of particle size} = \text{standard deviation of particle size/average particle size} \times 100$$

With respect to the measuring method for the above-mentioned particle-size distribution, prior to the coating of the metal surface particles, measurements can be carried out by using a grain-size distribution meter or the like, and after the coating thereof, measurements can be carried out by using an image analysis or the like of SEM photographs.

With respect to the above-mentioned insulating particles, preferably, not more than 20% of the surface area is brought into contact with the surface of each of the metal surface particles. In the case of the value of more than 20%, the deformation of the insulating particles becomes greater, making the thickness of the coating layer of the resulting coated conductive particles nonuniform, or making the bonding force between the insulating particles and the metal surface particles too strong; thus, even when contact-bonding processes are carried out between the electrodes, the insulating particles are not removed, with the result that defective conduction may occur. Here, with respect to the lower limit, not particularly limited, it may be virtually set to 0% in the case where the insulating particles and the metal surface particles are bonded by, for example, a polymer having a long chain, or the like.

The above-mentioned insulating particles are preferably allowed to have a positive charge. When the particles have a positive charge, it is possible to bond them to the metal surface particles by a hetero aggregation method, which will be described later, and since the above-mentioned insulating particles are made electrostatically repulsive from one another, it becomes possible to prevent the insulating particles from mutually aggregating with one another, and consequently to form a single coating layer. In other words, when the insulating particles are positively charged, the insulating particles are allowed to adhere onto each of the metal surface particles as a single layer. Moreover, in the case where such a positive charge is derived from an ammonium group or a sulfonium group, this group also serves as a functional group (A) having a bonding property to metal, which will be described later, allowing the insulating particles to directly form a chemical bond to the metal of the surface of each of the metal surface particles with ease. Therefore, the above-mentioned insulating particles are preferably made from a resin having an ammonium group or a sulfonium group. In particular, the particles are more preferably made from a resin containing a sulfonium group.

With respect to the insulating particles having a positive charge, examples thereof include those formed by mixing a polymerizable monomer having a positive charge therein upon manufacturing the insulating particles, those formed by a polymerizing process using a radical initiator having a positive charge and those formed by using a dispersion stabilizer or an emulsifier having a positive charge. Two or more kinds of these may be used in combination. Among these, the method using a polymerizable monomer having a positive charge or the method using a radical initiator is preferably adopted.

With respect to the polymerizable monomer having a positive charge, examples thereof include: ammonium-containing monomers such as N,N-dimethylaminoethyl methacrylate, N,N-dimethylaminopropyl acrylamide and N,N,N-trimethyl-N-2-methacryloyloxyethyl ammonium chloride, and monomers having a sulfonium group, such as methacrylic acid phenyldimethylsulfoniummethyl sulfate. With respect to the radical initiator having a positive charge, examples thereof include: 2,2'-azobis{2-methyl-N-[2-(1-hydroxy-butyl)]-propion amide}, 2,2'-azobis[2-(2-imidazoline-2-yl)propane], 2,2'-azobis(2-amidinopropane) and salts of these.

With respect to the coated conductive particles of the first aspect of the present invention, the above-mentioned metal surface particles and the insulating particles are chemically bonded via a functional group (A) having a bonding property to metal. The chemical bond provides a greater bonding force in comparison with a bonding force derived from only Van der Waals force and electrostatic force so that it becomes possible to prevent the separation of insulating particles from the metal surface particles when dispersed in a binder resin or the like as well as separation to cause leaking upon contact with the adjacent particles when the coated conductive particles are used as an anisotropic conductive material. Moreover, the chemical bond is formed only between the metal surface particles and the insulating particles, with no insulating particles being mutually bonded; therefore, the coating layer is formed by the insulating particles as a single layer. For this reason, when particles having properly adjusted particle sizes are used as the metal surface particles and the insulating particles, it is possible to easily prepare an uniform particle size for the coated conductive particles of the present invention.

With respect to the above-mentioned functional group (A), not particularly limited as long as it is capable of forming an ionic bond, a covalent bond or a coordinate bond with metal, examples thereof include: a silane group, a silanol group, a carboxyl group, an amino group, an ammonium group, a nitro group, a hydroxyl group, a carbonyl group, a thiol group, a sulfonic acid group, a sulfonium group, a boric acid group, an oxazoline group, a pyrrolidone group, a phosphoric acid group and a nitrile group. Among these, those functional groups capable of forming a coordinate bond are preferably used, and functional groups having S, N or P atoms are preferably used. For example, in the case where gold is used as the metal, those functional groups having S atoms that form a coordinate bond to gold, such as a thiol group and a sulfide group, are more preferably used.

With respect to the method for allowing the metal surface particles and the insulating particles to be chemically bonded to each other by using functional group (A), although not particularly limited, for example, 1) a method for introducing insulating particles, each having functional group (A) on its surface, onto the surface of each of the metal surface particles, and 2) a method in which functional group (A) and a compound having a reactive functional group (B) are directed onto the metal surface and each functional group (B) is allowed to react with the insulating particles by one step or multiple steps of reactions so as to be bonded to each other may be proposed.

With respect to the above-mentioned method 1), in the method for forming the insulating particles having functional group (A) on the surface thereof, not particularly limited, examples thereof include a method for mixing a monomer having functional group (A) in the insulating particles upon manufacturing the insulating particles; a method for directing functional group (A) to the surface of each of the insulating particles by a chemical bond; a method for chemically processing the surface of each of the insulating particles so that the surface is modified to have functional group (A); and a method for modifying the surface of each of the insulating particles to have functional group (A) by a plasma treatment or the like.

With respect to the above-mentioned method 2), for example, a method is proposed in which: a compound, which has functional group (A) and reactive functional group (B), such as hydroxyl group, carboxyl group, amino group, epoxy group, silyl group, silanol group and isocyanate group, in the same molecule is allowed to react with the metal surface particles, and this is then allowed to react with organic compound particles, each having a functional group capable of forming a covalent bond with reactive functional group (B) on its surface. With respect to the compound having functional group (A) and reactive functional group (B) in the same molecule, examples thereof include 2-aminoethane thiol and p-aminothiophenol. In the case where 2-aminoethane thiol is used, 2-aminoethane thiol is bonded to the surface of each of the metal surface particles via an SH group, with an amino group on the other side being allowed to react with, for example, insulating particles, each having an epoxy group, a carboxyl group or the like on its surface; thus, it becomes possible to bond the metal surface particles to the insulating particles.

When the connecting processes between electrodes are carried out by using the coated conductive particles of the first aspect of the present invention, a thermocompression-bonding process is conducted by applying heat and a pressure so that the metal surface of each of the metal surface particles is exposed so as to allow conduction. Here, the expression, "the metal surface is exposed", refers to a state in which the metal surface of the metal surface particles is directly brought into contact with the electrode without being interrupted by the insulating particles. With respect to conditions for the above-mentioned thermocompression-bonding, although not necessarily limited depending on the density of the coated conductive particles in the anisotropic conductive material and the kinds of the electronic parts to be connected, the temperature is normally set in a range from 120 to 220° C. with the pressure being set in a range from $9.8 \times 10^4$ to $4.9 \times 10^6$ Pa.

With respect to the mode in which the metal surface of each of the metal surface particles is exposed, the following three modes are considered.

The first mode is prepared as an arrangement in which upon thermocompression-bonding, the insulating particles are fused so that the metal surface of each of the metal surface particles is exposed.

The second mode is prepared as an arrangement in which upon thermocompression-bonding, the insulating particles are deformed so that the metal surface of each of the metal surface particles is exposed.

The third mode is prepared as an arrangement in which upon thermocompression-bonding, the metal surface particles and the insulating particles are separated from each other so that the metal surface of each of the metal surface particles is exposed.

Among these, it is preferable to use the second mode to expose the metal surface of each of the metal surface particles so as to allow conductive connection. In the case of the first mode, the fused insulating particles may bleed out to pollute the binder resin and the circuit boards, or the coating layer for insulating the gap between the adjacent coated conductive particles is also fused, failing to provide a sufficient insulating property, and in the case of the third mode, when, upon thermocompression-bonding, the metal surface particles and the insulating particles are aligned in the contact-bonding direction, the insulating particles are sandwiched between the metal surface particles and the circuit board, and are not separated in some cases, resulting in degradation in connection reliability.

As to which mode is used to expose the metal surface of each of the metal surface particles to allow conductive connection, normally, it is controlled based upon on the relative relationship between the hardness of the metal surface particles and the hardness of the insulating particles, although it depends on thermocompression-bonding conditions and the like. Here, the term, "the hardness of the particles", refers to a relative hardness under a thermocompression-bonding condition, and for example, in the case where the softening temperature of the insulating particles is low in comparison with the metal surface particles and when only the insulating particles are allowed to soften under the thermocompression-bonding condition, the insulating particles are relatively softer.

In the case where the insulating particles are relatively softer than the metal surface particles, normally, the above-mentioned first or second mode is used so that the metal surface of each of the metal surface particles is exposed to allow conductive connection. In other words, for example, when those particles having a melting point lower than the thermocompression-bonding temperature are used as the insulating particles, the insulating particles are softer under the thermocompression-bonding condition, with the result that the insulating particles are fused to flow, thereby exposing the metal surface of each of the metal surface particles. Further, when those particles which have a melting point higher than the thermocompression-bonding temperature, but have a softening point lower than the thermocompression-bonding temperature are used as the insulating particles, the insulating particles are softer under the thermocompression-bonding condition, the insulating particles are deformed and broken, thereby exposing the metal surface of each of the metal surface particles. With respect to such materials that have a melting point higher than the thermocompression-bonding temperature, but have a softening point lower than the thermocompression-bonding temperature, examples thereof include: crosslinking resins; and rubbers such as natural rubber and synthesized rubber.

In contrast, in the case where the insulating particles are harder than the metal surface particles, normally, the above-mentioned third mode is used so that the metal surface of each of the metal surface particles is exposed to allow conductive connection. In other words, for example, when such coated conductive particles are placed between electrodes to a thermocompression-bonding process, a stress is exerted between the metal surface particles and the insulating particles due to the contact-bonding process, and when this stress is more than the bonding force derived from the chemical bonding, the insulating particles are released from each of the metal surface particles, with the result that the metal surface of each of the metal surface particles is exposed.

With respect to the relative relationship between the hardness of the metal surface particles and the hardness of the insulating particles, for example, in the case where particles comprising core particles made from a resin and a conductive metal layer that is formed on the surface of each of the core particles are used as the above-mentioned metal surface particles, with a resin having an insulating property being used as the insulating particles, the adjustments can be made by properly selecting a) a kind of resin to be used as the core particles of the metal surface particles and a kind of resin to be used as the insulating particles; b) a crosslinking degree of the resin to be used as the core particles of the metal surface particles and a crosslinking degree of the resin to be used as the insulating particles; and c) a kind of metal and a thickness of a metal layer used for the metal surface particles and a kind of resin to be used as the insulating particles.

Here, in order to expose the metal surface of each of the metal surface particles, the coating rate of the insulating particles, that is, the area occupied by a portion coated with the insulating particles in the entire surface area of each of the metal surface particles, is preferably set in a range from 5 to 50%. In the case where the area is less than 5%, the adjacent coated conductive particles may mutually have an insufficient insulating property; in contrast, in the case where the area is more than 50%, with respect to the first mode, the amount of insulating particles to be fused and removed increases, with the result that heat and pressure need to be applied in a manner so as to be more than the required levels and that the removed resin may cause degradation in performances of the binder resin; with respect to the second mode, even if the insulating particles are deformed and broken, the metal surface sometimes is not sufficiently exposed; and with respect to the third mode, in order to push the adjacent insulating particles aside to separate the insulating particles in the thermocompression-bonding direction, a pressure needs to be applied in a manner so as to be more than the required level, and the insulating particles may be sandwiched between the metal surface particles and the electrodes, causing a higher possibility of defective conduction.

The following description will further discuss adjustments of the relative relationship between the hardness of such metal surface particles and the hardness of such insulating particles. For example, in the case where those particles that are made from a comparatively hard material, such as a comparatively hard metal like copper, nickel, iron and gold; a comparatively hard metal compounds like aluminum nitride; inorganic particles like silica; or a material composed of a core particle made from a resin in which the blended amount of a crosslinking monomer is not less than 50% by weight, and a metal layer formed thereon, are selected as the above-mentioned metal surface particles, the following materials are selected as the above-mentioned insulating particles so that an alignment is properly made as to which mode is used for exposing the metal surface of each of the metal surface particles to allow conductive connection.

In other words, for example, when a resin which has a blended amount of a crosslinking monomer of less than 1% by weight and a melting temperature in a range from 60 to 220° C. is selected as the insulating particles, the first mode is presumably adopted so that the metal surface of each of the metal surface particles is exposed to allow conductive connection. In this case, the gel fraction of the insulating particles is preferably set to not more than 50%. With respect to the material for such insulating particles, for example, a methyl methacrylate/styrene copolymer containing about 0.5% by weight of divinyl benzene or ethylene glycol dimethacrylate as crosslinking monomers is proposed. Here, when the melting temperature is less than 60° C., the coated conductive particles may be adhered with one another upon transportation and storage. Moreover, in the case where the blended amount of the crosslinking monomer is 0%, the particles may be dissolved in an organic solvent upon dispersing a binder resin and the like.

Moreover, for example, when a resin which has a blended amount of a crosslinking monomer of 1 to 20% by weight and a softening temperature of 60 to 220° C. is selected as the material for the insulating particles, the second mode is presumably adopted so that the metal surface of each of the metal surface particles is exposed to allow conductive connection. In this case, the gel fraction of the insulating particles is preferably set to not less than 50%. With respect to the material for such insulating particles, for example, a methyl methacrylate/styrene copolymer containing about 3% by weight of divinyl benzene as a crosslinking monomer, and a resin containing about 5% by weight of divinyl benzene or ethylene glycol dimethacrylate are proposed.

Furthermore, for example, when a resin, which have a blended amount of a crosslinking monomer of not less than 50% by weight and are not softened and inorganic particles, are selected as the materials for the insulating particles, the third mode is presumably adopted so that the metal surface of each of the metal surface particles is exposed to allow conductive connection. In this case, the gel fraction of the insulating particles is preferably set to not less than 80%. With respect to the material for such insulating particles, for example, a resin containing about 80% by weight of divinyl benzene and pentaerythritol tetracrylate as crosslinking monomers, silica, aluminum nitride and the like are proposed.

Among these, a combination of a resin containing not less than 50% by weight of a crosslinking monomer serving as core particles, metal surface particles having a nickel/gold layer as a metal layer and insulating particles made from a styrene copolymer resin containing 2 to 5% by weight of a multifunctional (meth)acrylate, such as divinyl benzene, ethylene glycol dimethacrylate and pentaerythritol tetracrylate, as crosslinking monomers is one of the most superior material from the viewpoint of connection reliability, and more preferably used.

With respect to the method for forming the coated conductive particles in accordance with the first aspect of the present invention, although not particularly limited as long as it is a method for allowing the above-mentioned insulating particles to contact the surface of each of the metal surface particles to be chemically bonded thereto, for example, a method, which includes a step 1 in which at least insulating particles are allowed to aggregate on each of particles that has a surface made from conductive metal by a Van der Waals force or an electrostatic interaction in an organic solvent and/or water and a step 2 in which the particle having the surface made from conductive metal and the insulating particles are chemically bonded to each other, is preferably used. The aggregation method of step 1 is referred to as a hetero aggregation method, and since this method ensures a swift chemical reaction between the metal surface particles and the insulating particles by solvent effects, it is not necessary to apply an excessive pressure and it is possible to easily control the temperature of the entire system; therefore, the insulating particles are less susceptible to deformation or the like due to heat. In contrast, when the insulating particles are directed by a conventional dry method using a high-speed stirrer, a hybridizer or the like, an excessive pressure or load such as frictional heat may be applied; consequently, in the case where the insulating particles are harder than the metal surface particles, the metal surface particles may be damaged or the metal layer may be separated, and in the case where the insulating particles are softer than the metal surface particles and when the glass transition temperature of the insulating particles is low, the insulating particles are deformed due to collision against the metal surface particles and frictional heat, causing disadvantages that the contact area becomes larger, that the insulating layer thickness becomes nonuniform, that the insulating particles are laminated and stacked and that the insulating particles are fused to make the coated conductive particles joined to each other to fail to form a single particle.

With respect to the organic solvent, any solvent may be used without limitation as long as it does not dissolve the insulating particles.

Another aspect of the present invention, which relates to the method for manufacturing the coated conductive particles of the first aspect of the present invention, provides a method which comprises at least the steps of a step 1 of allowing insulating particles to aggregate onto the particle having the surface made of conductive metal by a Van der Waals force or an electrostatic interaction in an organic solvent and/or water; and a step 2 of chemically bonding the particle having the surface made of conductive metal and the insulating particles to each other.

In the coated conductive particles of the first aspect of the present invention, since the metal surface particles and the insulating particles are chemically bonded to each other, it is possible to prevent the insulating particles from separation due to a weak bonding force between the insulating particles and the metal surface, upon dispersing them with a binder resin and the like and upon allowing them to contact the adjacent particles. Moreover, since the insulating particles form a single coating layer and have a small particle-size distribution of the insulating particles, and since the contact area between the insulating particles and the metal surface is constant, it is possible to provide an uniform particle size with respect to the coated conductive particles.

In the case where the coated conductive particles of the first aspect of the present invention are used as an anisotropic conductive material, it becomes possible to expose the metal surface of the metal surface particles by a thermo-compression-bonding process upon connection to ensure positive conduction, and since it is possible to prevent the insulating particles from coming off the surface of each of the metal surface particles uniform by a pressure imposed between the adjacent particles, and consequently to ensure a positive insulating property.

The coated conductive particles of the first aspect of the present invention are used for applications such as an anisotropic conductive material, a heat-ray reflection material and an electromagnetic-wave shielding material. Among these, when dispersed in an insulating binder resin, the coated conductive particles are desirably used as an anisotropic conductive material.

A second aspect of the present invention relates to an anisotropic conductive material formed by dispersing the coated conductive particles of the first aspect of the present invention in an insulating binder resin. In the present specification, the anisotropic conductive material includes an anisotropic conductive film, an anisotropic conductive paste, an anisotropic conductive adhesive, an anisotropic conductive ink and the like.

With respect to the method for forming the above-mentioned anisotropic conductive film, not particularly limited, for example, a method is proposed in which the coated conductive particles of the present invention are suspended in a solvent to which a binder resin has been added, this suspended solution is put and drawn on a mold-releasing film to form a coat film, and the resulting film formed by evaporating the solvent from the coat film is wound up onto a roll. Upon conductive connection by the use of the above-mentioned anisotropic conductive film, the coat film is drawn out together with the mold-releasing film, and the coat film is put on an electrode to which it is bonded, and an opposing electrode is superposed on this to be connected thereto by a thermocompression-bonding process.

The above-mentioned anisotropic conductive paste is prepared, for example, by forming an anisotropic conductive adhesive into paste, and this is loaded into an appropriate dispenser, and applied onto an electrode to be connected with a desired thickness, and an opposing electrode is superposed on this and the resin is cured by a thermocompression-bonding process so that the connection is made.

The above-mentioned anisotropic conductive ink is prepared by, for example, by adding a solvent to an anisotropic conductive adhesive to provide appropriate viscosity for printing, and this is screen-printed on an electrode to be bonded, and the solvent is then evaporated, and an opposing electrode is superposed on this and subjected to a thermocompression-bonding process so that the connection is made.

With respect to the film thickness of the coat film of the above-mentioned anisotropic conductive material, preferably, calculations are conducted based upon the average particle size of the coated conductive particles of the present invention to be used and the specification of the electrodes to be connected so that the coated conductive particles are properly sandwiched between the electrodes to be connected, with a gap between joining circuit boards being sufficiently filled with the adhesive layer.

With respect to the insulating binder resin, not particularly limited as long as it has an insulating property, examples thereof include: thermoplastic resins such as acrylates, ethylene-vinyl acetate resins, styrene-butadiene block copolymers and hydrogenated products thereof; styrene-isoprene block copolymers and hydrogenated products thereof thermosetting resins such as epoxy resins, acrylate resins, melamine resins, urea resins and phenolic resins; and resins to be cured by ultraviolet rays and electron beams, such as acrylates of polyhydric alcohol, polyester acrylates and unsaturated esters of polyhydric carboxylic acid. Among these, adhesives which are cured by heat and/or light are preferably used.

In the anisotropic conductive material in accordance with the second aspect of the present invention, a functional group contained in the insulating particles of the coated conductive particles of the first aspect of the present invention to be contained therein is preferably chemically bonded to a functional group in a binder resin. The above-mentioned insulating particles and the binder resin are chemically bonded to each other so that the coated conductive particles of the first aspect of the present invention, dispersed in the binder resin, are allowed to have superior stability, and so that it is possible to prevent thermally-fused insulating particles from bleeding out to pollute electrodes and liquid crystal; thus, it becomes possible to prepare an anisotropic conductive material that is superior in long-term connection stability and reliability.

With respect to the combination between such insulating particles and the binder resin, the insulating particles are preferably allowed to have a functional group such as carboxyl group, epoxy group, isocyanate group, amino group, hydroxyl group, sulfone group, silane group and silanol group, and among these, the insulating particles preferably contain epoxy group. In contrast, with respect to the binder resin, a (co)polymer, which has a functional group capable of reacting with these functional groups at normal temperature, under heat or upon irradiation with light, and a monomer or the like, which has the above-mentioned reactive functional group, and forms a (co)polymer and a polycondensation product by a polymerizing reaction or a polycondensing reaction, are preferably used. These binder resins may be used alone, or two or more kinds of these may be used in combination.

With respect to the above-mentioned (co)polymer, not particularly limited, examples thereof include: polyolefins such as polyethylene and polybutadiene; polyethers such as polyethylene glycol and polypropylene glycol; polystyrene, poly(meth)acrylic acid, poly(meth)acrylate, polyacrylamide, polyvinyl alcohol, polyvinyl ester, phenolic resin, melamine resin, allyl resin, furan resin, polyester, epoxy resin, silicone resin, polyimide resin, polyurethane, fluororesin, acrylonitrile-styrene copolymer resin, styrene-butadiene copolymer resin, vinyl resin, polyamide resin, polycarbonate, polyacetal, polyether sulfone, polyphenylene oxide, sugar, starch, cellulose and polypeptide. These (co)polymers may be used alone, or two or more kinds of these may be used in combination.

Moreover, with respect to the monomer capable of forming the above-mentioned (co)polymer and polycondensation product, not particularly limited, examples thereof include a vinyl-based monomer that carries out a polymerizing reaction by using, for example, heat, light, an electron beam, a radical polymerization initiator, a polymerization catalyst or the like, and a monomer that carries out a polycondensation reaction. These monomers may be used alone or two or more kinds of these may be used in combination.

In addition to the binder resin and the coated conductive particles of the first aspect of the present invention that are essential components, to the anisotropic conductive material of the second aspect of the present invention, for example, one or two or more kinds of the following various additives may be added within a range so as not to impair the objectives of the present invention: a filler, an extender, a softener, a plasticizer, a polymerizing catalyst, a curing catalyst, a colorant, an antioxidant, a thermal stabilizer, a light-stabilizer, an ultraviolet-ray absorbing agent, a lubricant, an antistatic agent and a non-flammable agent.

With respect to the method for dispersing the coated conductive particles of the first aspect of the present invention in the above-mentioned binder resin, not particularly limited, conventionally known dispersing methods may be used; and the following methods are proposed: dispersion methods in which a mechanical shearing force is applied, such as a method in which, after coated conductive particles have been added to a binder resin, this mixture is dispersed by a planetary mixer or the like so that the particles are dispersed; a method in which, after coated conductive particles have been uniformly dispersed in water or an organic solvent by using a homogenizer or the like, this dispersion solution is added to a binder resin and kneaded by a planetary mixer or the like to be dispersed; and a method in which, after a binder resin has been diluted by water, an organic solvent or the like, coated conductive particles are added to this solution, and dispersed and dispersed by using a planetary mixer or the like. These dispersing methods may be used alone or two or more kinds of these may be used in combination.

With respect to the method for applying a mechanical shearing force, not particularly limited, for example, various mixing and stirring devices, such as a planetary stirrer, an universal stirrer, a planetary mixer, a roll, a propeller stirrer and a disper, and various mixing and stirring methods using these devices are used. Here, upon applying the above-mentioned mechanical shearing force, preferably, a method and conditions are properly selected so as not to apply such a great mechanical shearing force as to damage the structure of the coated conductive particle of the first aspect of the present invention to be dispersed in the binder resin.

With respect to the mode of the anisotropic conductive material of the second aspect of the present invention, not particularly limited, for example, an insulating liquid-state or solid-state adhesive is used as a binder resin, and coated particles of the present invention are dispersed in this adhesive; thus, an amorphous anisotropic conductive adhesive may be formed and applied, or a regular-shape anisotropic conductive film may be used.

A third aspect of the present invention relates to a conductive-connection structure formed by conductive-connecting electronic parts such as IC chips and circuit boards by using the coated conductive particles of the first aspect of the present invention or the anisotropic conductive material of the second aspect of the present invention.

BEST MODE FOR CARRYING OUT THE INVENTION

The present invention will be described in more detail by way of examples, but the invention is not restricted only to these examples.

1. Preparation of Insulating Particles [1] to [8]

(1) Preparation of Insulating Particles [1]

To distilled water in a separable flask (1000 mL) equipped with a four-neck separable cover, a stirring blade, a three-way stopcock, a condenser and a temperature probe was added a monomer composition composed of 100 mmol of methyl methacrylate, 1 mmol of N,N,N-trimethyl-N-2-methacryloyloxyethyl ammonium chloride and 1 mmol of 2,2'-azobis(2-amidinopropane) dihydrochloride so that its solid component content was set to 5% by weight therein, and this was then stirred at 200 rpm, and subjected to a polymerizing process at 70° C. in a nitrogen atmosphere for 24 hours. After completion of the reaction, the resulting matter was frozen and dried to prepare insulating particles [1] having an average particle-size of 220 nm and a CV value of the particle size of 10%, with an ammonium group being contained in the surface thereof.

(2) Preparation of Insulating Particles [2]

The same preparation processes as the insulating particles [1] were carried out except that the monomer composition was changed to contain 50 mmol of styrene, 50 mmol of glycidyl methacrylate and 1 mmol of 2,2'-azobis(2-amidinopropane) dihydrochloride to obtain insulating particles [2] having an average particle-size of 210 nm and a CV value of the particle size of 13%, with an amidino group and an epoxy group being contained in the surface thereof.

(3) Preparation of Insulating Particles [3]

Into 500 mL of dehydrated ethanol in a separable flask (1000 mL) equipped with a four-neck separable cover, a stirring blade, a three-way stopcock was dissolved 100 mmol of 3-isocyanate propyltriethoxysilane. In this solution was dispersed 10 g of silica particles having a particle size of about 200 nm in a nitrogen atmosphere, and stirred at room temperature for 12 hours. Unreacted aminopropyltrimethoxysilane was removed therefrom by a centrifugal-separation washing process, and the dispersion medium was substituted from ethanol to toluene to prepare a toluene dispersion solution (solid component content 5%) of insulating particles [3] with an isocyanate group being contained in the surface thereof.

(4) Preparation of Insulating Particles [4]

The same preparation processes as the insulating particles [1] were carried out except that the monomer composition was changed to contain 50 mmol of glycidyl methacrylate, 50 mmol of methyl methacrylate, 3 mmol of ethylene glycol dimethacrylate, 1 mmol of methacrylic acid phenyldimethylsulfoniummethyl sulfate and 2 mmol of 2,2'-azobis{2-[N-(2-carboxyethyl)amidino]propane} to prepare insulating particles [4] having an average particle-size of 180 nm and a CV value of the particle size of 7%, with a sulfonium group and an epoxy group being contained in the surface thereof.

(5) Preparation of Insulating Particles [5]

The same preparation processes as the insulating particles [1] were carried out except that the monomer composition was changed to contain 100 mmol of isobutyl methacrylate, 3 mmol of ethylene glycol dimethacrylate, 3 mmol of methacrylic acid phenyldimethylsulfoniummethyl sulfate and 1 mmol of 2,2'-azobis{2-[N-(2-carboxyethyl)amidino]propane} to prepare insulating particles [5] having an average particle-size of 190 nm and a CV value of the particle size of 11%, with a sulfonium group being contained in the surface thereof.

(6) Preparation of Insulating Particles [6]

The same preparation processes as the insulating particles [1] were carried out except that the monomer composition was changed to contain 100 mmol of t-butyl methacrylate, 5 mmol of ethylene glycol dimethacrylate, 1 mmol of N,N,N-trimethyl-N-2-methacryloyloxyethyl ammonium chloride and 1 mmol of 2,2'-azobis(2-amidinopropane) dihydrochloride to prepare insulating particles [6] having an average particle-size of 210 nm and a CV value of the particle size of 13%, with an ammonium group being contained in the surface thereof.

(7) Preparation of Insulating Particles [7]

The same preparation processes as the insulating particles [1] were carried out except that the monomer composition was changed to contain 50 mmol of glycidyl methacrylate, 50 mmol of styrene, 10 mmol of ethylene glycol dimethacrylate, 10 mmol of divinyl benzene, 1 mmol of methacrylic acid phenyldimethylsulfoniummethyl sulfate and 2 mmol of 2,2'-azobis{2-[N-(2-carboxyethyl) amidino]propane} to prepare insulating particles [7] having an average particle-size of 190 nm and a CV value of the particle size of 10%, with a sulfonium group and an epoxy group being contained in the surface thereof.

(8) Preparation of Insulating Particles [8]

The same preparation processes as the insulating particles [1] were carried out except that the monomer composition was changed to contain 500 mmol of styrene, 2 mmol of sodium p-styrene sulfonate, 1 mmol of potassium persulfate and that distilled water was added thereto to set the solid component content to 10% by weight to prepare insulating particles [8] having an average particle-size of 120 nm and a CV value of the particle size of 10%, with a sulfonic acid group being contained in the surface thereof.

2. Preparation of Metal Surface Particles [1] and [2]

(1) Preparation of Metal Surface Particles [1]

Core particles made from tetramethylol methane tetracrylate/divinyl benzene having an average particle size of 5 µm were subjected to defatting, sensitizing and activating processes to form Pd cores on the surface of core particles so as to form catalyst cores for electroless plating. Next, these particles were immersed into an electroless Ni plating bath that has been initially prepared and heated in accordance with a predetermined method so that a Ni plated layer was formed. Next, the surface of the nickel layer was subjected to an electroless substitution gold plating process to prepare metal-surface particles. The resulting metal surface particles have a Ni-plating thickness of 90 nm and a gold plating thickness of 30 nm.

(2) Preparation of Metal Surface Particles [2]

To 1000 mL of methanol in a separable flask (2000 mL) equipped with a four-neck separable cover, a stirring blade and a three-way stopcock was added and dissolved 20 mmol of 2-aminoethane thiol to prepare a reaction solution.

In the reaction solution were dispersed 20 g of metal surface particles [1] under a nitrogen atmosphere and stirred at room temperature for 3 hours, and unreacted 2-aminoethane thiol was removed therefrom by a filtering process, and the resulting matter was washed with methanol, and dried to prepare metal surface particles [2] with an amino group serving as a reactive functional group being contained in the surface thereof.

3. Preparation of Coated Conductive Particles

EXAMPLE 1

Insulating particles [1] were dispersed in distilled water under irradiation with ultrasonic wave to obtain an aqueous dispersion solution having 10% by weight of insulating particles [1].

In 500 mL of distilled water were dispersed 10 g of metal surface particles [1], and to this was added 4 g of aqueous dispersion solution of insulating particles [1], and stirred at room temperature for 6 hours. After having been filtered through a mesh-filter of 3 µm, this was further washed with methanol, and dried to obtain coated conductive particles [1].

When each of coated conductive particles [1] was observed under a scanning electronic microscope (SEM), only one coating layer was formed on the surface of each of metal surface particles [1] by insulating particles [1]. When the coated area (that is, the projection area of the particle size of each insulating particle) of the insulating particles with respect to an area of 2.5 µm from the center of the coated conductive particle was calculated by an image analysis, a coating rate of 30% was obtained. Moreover, a cross-sectional observation by a transmission electronic microscope (TEM) showed that a bonding interface between the insulating particles and the metal surface particle was 12% of the circumference of the insulating particle; therefore, the interface bonding area to the metal surface particle was 12% of the surface area of the insulating particle.

Coated conductive particles [1] were dispersed in t-butyl alcohol, and weighed so that after the drying process, the weight of the coated conductive particles was set to 0.00004 g (about 240,000 particles) per 10×10 mm on a silicon wafer, and after the drying process, a silicon wafer of 10×10 mm was put thereon, and after having been heated at 200° C. for 30 seconds under a pressure of 100 N, the silicon wafer was pulled and separated therefrom. When the state of the insulating particles on the surface of the coated particle was observed under an SEM, it was found that the metal surface of metal surface particles [1] was exposed due to fused insulating particles [1] with particles adhering onto the silicon wafer side being also fused.

The results of these tests are shown in Table 1.

EXAMPLE 2

Insulating particles [2] were dispersed in acetone under irradiation with ultrasonic wave to obtain an acetone dispersion solution having 10% by weight of insulating particles [2].

In 500 mL of acetone were dispersed metal surface particles [1], and to this was added 4 g of acetone dispersion solution of insulating particles [2], and stirred at room temperature for 12 hours. After having been filtered through a mesh-filter of 3 µm, this was further washed with methanol, and dried to obtain coated conductive particles [2].

In coated conductive particles [2], only one coating layer was formed on the surface of each of metal surface particles [1] by insulating particles [2]. When measured in the same method as example 1, the coating rate thereof was 70%, and the interface bonding area was 15% of the surface area of the insulating particle. Moreover, when the state thereof after having been thermocompression-bonded between silicon wafers was observed under an SEM in the same method as example 1, it was found that the metal surface of metal surface particles [1] was exposed due to fused insulating particles [2] with particles adhering onto the silicon wafer side being also fused.

The results of these tests are shown in Table 1.

EXAMPLE 3

Insulating particles [3] were dispersed in toluene under irradiation with ultrasonic wave to obtain a toluene dispersion solution having 10% by weight of insulating particles [3].

In 500 mL of toluene were dispersed metal surface particles [2], and to this was added 4 g of the toluene dispersion solution of insulating particles [3], and stirred at room temperature for 4 hours. After having been filtered through a mesh-filter of 3 µm, this was further washed with acetone, and dried to obtain coated conductive particles [3].

In coated conductive particles [3], only one coating layer was formed on the surface of each of metal surface particles [2] by insulating particles [3]. When measured in the same method as example 1, the coating rate thereof was 40%, and the interface bonding area was 5% of the surface area of the insulating particle. Moreover, when the state thereof after having been thermocompression-bonded between silicon wafers was observed under an SEM in the same method as example 1, it was found that the metal surface of metal surface particles [2] was exposed due to separation of insulating particles [3], and some separated insulating particles [3] were observed on the periphery of each coated conductive particle.

The results of these tests are shown in Table 1.

EXAMPLE 4

Insulating particles [4] were dispersed in acetone under irradiation with ultrasonic wave to obtain an acetone dispersion solution having 10% by weight of insulating particles [4].

In 500 mL of acetone were dispersed metal surface particles [2], and to this was added 1 g of the acetone dispersion solution of insulating particles [4], and stirred at room temperature for one hour. After having been filtered through a mesh-filter of 3 μm, this was further washed with methanol, and dried to obtain coated conductive particles [4].

In coated conductive particles [4], only one coating layer was formed on the surface of each of metal surface particles [2] by insulating particles [4]. When measured in the same method as example 1, the coating rate thereof was 8%, and the interface bonding area was 12% of the surface area of the insulating particle. Moreover, when the state thereof after having been thermocompression-bonded between silicon wafers was observed under an SEM in the same method as example 1, it was found that the metal surface of metal surface particles [2] was exposed due to deformation of insulating particles [4], with insulating particles [4] adhering onto the silicon wafer side being also deformed. However, neither fused insulating particles [4] nor separated insulating particles [4] were found.

The results of these tests are shown in Table 1.

EXAMPLE 5

By using the same method as example 4, an acetone dispersion solution having 10% by weight of insulating particles [4] was obtained.

In 500 mL of acetone were dispersed metal surface particles [2], and to this was added 3 g of the acetone dispersion solution of insulating particles [4], and stirred at room temperature for 3 hours. After having been filtered through a mesh-filter of 3 μm, this was further washed with methanol, and dried to obtain coated conductive particles [5].

In coated conductive particles [5], only one coating layer was formed on the surface of each of metal surface particles [2] by insulating particles [4]. When measured in the same method as example 1, the coating rate thereof was 20%, and the interface bonding area was 12% of the surface area of the insulating particle. Moreover, when the state thereof after having been thermocompression-bonded between silicon wafers was observed under an SEM in the same method as example 1, it was found that the metal surface of metal surface particles [2] was exposed due to deformation of insulating particles [4], with insulating particles [4] adhering onto the silicon wafer side being also deformed. However, neither fused insulating particles [4] nor separated insulating particles [4] were found.

The results of these tests are shown in Table 1.

EXAMPLE 6

By using the same method as example 4, an acetone dispersion solution having 10% by weight of insulating particles [4] was obtained.

In 500 mL of acetone were dispersed metal surface particles [2], and to this was added 4 g of the acetone dispersion solution of insulating particles [4], and stirred at room temperature for 6 hours. After having been filtered through a mesh-filter of 3 μm, this was further washed with methanol, and dried to obtain coated conductive particles [6].

In coated conductive particles [6], only one coating layer was formed on the surface of each of metal surface particles [2] by insulating particles [4]. When measured in the same method as example 1, the coating rate thereof was 40%, and the interface bonding area was 12% of the surface area of the insulating particle. Moreover, when the state thereof after having been thermocompression-bonded between silicon wafers was observed under an SEM in the same method as example 1, it was found that the metal surface of metal surface particles [2] was exposed due to deformation of insulating particles [4], with insulating particles [4] adhering onto the silicon wafer side being also deformed. However, neither fused insulating particles [4] nor separated insulating particles [4] were found.

The results of these tests are shown in Table 1.

EXAMPLE 7

Insulating particles [5] were dispersed in acetone under irradiation with ultrasonic wave to obtain an acetone dispersion solution having 10% by weight of insulating particles [5].

In 500 mL of acetone were dispersed metal surface particles [1], and to this was added 4 g of the acetone dispersion solution of insulating particles [5], and stirred at room temperature for 6 hours. After having been filtered through a mesh-filter of 3 μm, this was further washed with methanol, and dried to obtain coated conductive particles [7].

In coated conductive particles [7], only one coating layer was formed on the surface of each of metal surface particles [1] by insulating particles [5]. When measured in the same method as example 1, the coating rate thereof was 30%, and the interface bonding area was 12% of the surface area of the insulating particle. Moreover, when the state thereof after having been thermocompression-bonded between silicon wafers was observed under an SEM in the same method as example 1, it was found that the metal surface of metal surface particles [1] was exposed due to deformation of insulating particles [5], with insulating particles [5] adhering onto the silicon wafer side being also deformed. However, neither fused insulating particles [5] nor separated insulating particles [5] were found.

The results of these tests are shown in Table 1.

EXAMPLE 8

Insulating particles [6] were dispersed in acetone under irradiation with ultrasonic wave to obtain an acetone dispersion solution having 10% by weight of insulating particles [6].

In 500 mL of acetone were dispersed metal surface particles [1], and to this was added 4 g of the acetone dispersion solution of insulating particles [6], and stirred at room temperature for 6 hours. After having been filtered through a mesh-filter of 3 μm, this was further washed with methanol, and dried to obtain coated conductive particles [8].

In coated conductive particles [8], only one coating layer was formed on the surface of each of metal surface particles

[1] by insulating particles [6]. When measured in the same method as example 1, the coating rate thereof was 30%, and the interface bonding area was 10% of the surface area of the insulating particle. Moreover, when the state thereof after having been thermocompression-bonded between silicon wafers was observed under an SEM in the same method as example 1, it was found that the metal surface of metal surface particles [1] was exposed due to deformation of insulating particles [6], with insulating particles [6] adhering onto the silicon wafer side being also deformed. However, neither fused insulating particles [6] nor separated insulating particles [6] were found.

The results of these tests are shown in Table 1.

EXAMPLE 9

Insulating particles [7] were dispersed in acetone under irradiation with ultrasonic wave to obtain an acetone dispersion solution having 10% by weight of insulating particles [7].

In 500 mL of acetone were dispersed metal surface particles [2], and to this was added 4 g of the acetone dispersion solution of insulating particles [7], and stirred at room temperature for 5 hours. After having been filtered through a mesh-filter of 3 am, this was further washed with methanol, and dried to obtain coated conductive particles [9].

In coated conductive particles [9], only one coating layer was formed on the surface of each of metal surface particles [2] by insulating particles [7]. When measured in the same method as example 1, the coating rate thereof was 35%, and the interface bonding area was 8% of the surface area of the insulating particle. Moreover, when the state thereof after having been thermocompression-bonded between silicon wafers was observed under an SEM in the same method as example 1, it was found that the metal surface of metal surface particles [2] was exposed due to deformation of insulating particles [7], with insulating particles [7] adhering onto the silicon wafer side being also deformed. However, neither fused insulating particles [7] nor separated insulating particles [7] were found.

The results of these tests are shown in Table 1.

COMPARATIVE EXAMPLE 1

Insulating particles [8] were dispersed in distilled water under irradiation with ultrasonic wave to obtain an aqueous dispersion solution having 10% by weight of insulating particles [8].

In 500 mL of distilled water were dispersed metal surface particles [1], and to this was added 4 g of the aqueous dispersion solution of insulating particles [8], and stirred at room temperature for 6 hours. After having been filtered through a mesh-filter of 3 μm, this was further washed with methanol, and dried to obtain coated conductive particles [10].

In coated conductive particles [10], aggregated lumps of insulating particles [8] were formed on the surface of each of metal surface particles [1]. When measured in the same method as example 1, the coating rate thereof was 50%, and the interface bonding area was 12% of the surface area of the insulating particle. Moreover, when the state thereof after having been thermocompression-bonded between silicon wafers was observed under an SEM in the same method as example 1, insulating particles [8] on each of coated conductive particles [10] were fused; however, there were some coated conductive particles in which the metal surface of each of metal surface particles [1] was not exposed, and there were some particles adhering onto the silicon wafer side that were not sufficiently fused. The reason for this is explained as follows: in the case of coated conductive particles [10], since insulating particles [8] form multiple layers, it is difficult to fuse these so as to be removed and it is also difficult to apply an uniform pressure onto the respective insulating particles [8].

The results of these tests are shown in Table 1.

COMPARATIVE EXAMPLE 2

To a hybridization system were loaded 1 g of vinylidene fluoride resin and 10 g of metal surface particles [1] so that these were subjected to treatments at 90° C. for 3 minutes to obtain coated conductive particles [11]

In coated conductive particles [11], a resin layer, made from the vinylidene fluoride resin, was formed on the surface of each of metal surface particles [1]. When measured in the same method as example 1, the coating rate thereof was 60%. Moreover, when the state thereof after having been thermocompression-bonded between silicon wafers was observed under an SEM in the same method as example 1, the vinylidene fluoride resin on coated conductive particles [11] was completely fused so that the metal surface of each of metal surface particles [1] was exposed.

The results of these tests are shown in Table 1.

COMPARATIVE EXAMPLE 3

To a ball mill were loaded 1 g of silica particles used in forming insulating particles [3] and 10 g of metal surface particles [1], and mixed for 20 minutes so as to allow these to electrostatically adhere to one another; thus, coated conductive particles [12] were obtained.

In coated conductive particles [12], only one layer of silica particles was formed on the surface of each of metal surface particles [1]. When measured in the same method as example 1, the coating rate thereof was 30%, and the interface bonding area was 5% of the surface area of the insulating particle. Moreover, when the state thereof after having been thermocompression-bonded between silicon wafers was observed under an SEM in the same method as example 1, it was found that the metal surface of metal surface particles [1] was exposed due to separation of the silica particles, and there were some separated silica particles on the periphery of each of the coated conductive particles.

The results of these tests are shown in Table 1.

COMPARATIVE EXAMPLE 4

The same processes as example 4 were carried out to prepare an acetone dispersion solution having 10% by weight of insulating particles [4].

In 500 mL of acetone were dispersed metal surface particles [2], and to this was added 6 g of the acetone dispersion solution of insulating particles [4], and stirred at room temperature for 12 hours. After having been filtered through a mesh-filter of 3 μm, this was further washed with methanol, and dried to obtain coated conductive particles [13].

In coated conductive particles [13], only one coating layer was formed on the surface of each of metal surface particles [2] by insulating particles [4]. When measured in the same method as example 1, the coating rate thereof was 60%, and the interface bonding area was 12% of the surface area of the insulating particle. Moreover, when the state thereof after having been thermocompression-bonded between silicon wafers was observed under an SEM in the same method as example 1, it was found that although insulating particles [4] were deformed, there were some coated conductive particles having metal surface particles [2] whose metal surface was not exposed. This is presumably because the high coating density of the insulating particles or the multilayered coating structure thereof makes it difficult for the metal surface to be exposed.

The results of these tests are shown in Table 1.

COMPARATIVE EXAMPLE 5

To a ball mill were loaded 1 g of insulating particles [4] and 10 g of metal surface particles [1], and mixed for 20 minutes so as to allow these to electrostatically adhere to one another; thus, coated conductive particles [14] were obtained.

In coated conductive particles [15], insulating particles [4] covering the surface of each of metal surface particles [2] were deformed by heat and impact, and the coated layer was formed by multiple layers. When measured in the same method as example 1, the coating rate thereof was 70%, and the interface bonding area was 40% of the surface area of the insulating particle. Moreover, when the state thereof after having been thermocompression-bonded between silicon wafers was observed under an SEM in the same method as example 1, it was found that although insulating particles [4] were deformed, there were some coated conductive particles having metal surface particles [2] whose metal surface was not exposed. This is presumably because the high coating density of the insulating particles or the multilayered coating structure thereof makes it difficult for the metal surface to be exposed.

The results of these tests are shown in Table 1.

TABLE 1

|  | Metal surface particles | Insulating particles | Coating rate (%) | Bonding area (%) | Coated state | State of insulating particles upon contact bonding |
|---|---|---|---|---|---|---|
| Example 1 | 1 | 1 | 30 | 12 | Single layer | Fused |
| Example 2 | 1 | 2 | 70 | 15 | Single layer | Fused |
| Example 3 | 2 | 3 | 40 | 5 | Single layer | Separated |
| Example 4 | 2 | 8 | 8 | 12 | Single layer | Deformed |
| Example 5 | 2 | 4 | 20 | 12 | Single layer | Deformed |
| Example 6 | 2 | 4 | 40 | 12 | Single layer | Deformed |
| Example 7 | 1 | 5 | 30 | 12 | Single layer | Deformed |
| Example 8 | 1 | 6 | 30 | 10 | Single layer | Deformed |
| Example 9 | 2 | 7 | 35 | 8 | Single layer | Deformed |
| Comparative Example 1 | 1 | 8 | 50 | 12 | Multi-layer | Fused (partially separated) |
| Comparative Example 2 | 1 | Vinylidene flouride resin | 60 | — | — | Fused |
| Comparative Example 3 | 1 | Silica particles | 30 | 5 | Single layer | Separated |
| Comparative Example 4 | 2 | 4 | 60 | 12 | Single layer | Deformed |
| Comparative Example 5 | 1 | 4 | 30 | 8 | Multi-layer | Partially deformed and separated |
| Comparative Example 6 | 2 | 4 | 70 | 40 | Multi-layer | Deformed |

In coated conductive particles [14], 1 to 3 coated layers were formed on the surface of each of metal surface particles [1] by insulating particles [4]. When measured in the same method as example 1, the coating rate thereof was 30%, and the interface bonding area was 8% of the surface area of the insulating particle. Moreover, when the state thereof after having been thermocompression-bonded between silicon wafers was observed under an SEM in the same method as example 1, it was found that although some of insulating particles [4] were deformed, many of them were separated with the metal surface of metal surface particles [1] being exposed, and there were some separated insulating particles on the periphery of each of the coated conductive particles.

The results of these tests are shown in Table 1.

COMPARATIVE EXAMPLE 6

To a hybridization system were loaded 1 g of insulating particles [4] and 10 g of metal surface particles [2] so that these were subjected to treatments at 120° C. for 3 minutes to obtain coated conductive particles [15].

4. Preparation of Anisotropic Conductive Material

EXAMPLE 10

Epoxy resin ("Epicoat 828": made by Yuka Shell Epoxy Co., Ltd.)(100 parts) serving as a binder resin and trisdimethyl aminoethyl phenol and toluene (100 parts) were sufficiently dispersed and mixed by using a planetary stirring device, and this was applied onto a releasing film with a fixed thickness so as to form a thickness of 10 μm after drying, and toluene was evaporated so that an adhesive film without containing coated conductive particles was obtained.

Moreover, to the epoxy resin ("Epicoat 828": made by Yuka Shell Epoxy Co., Ltd.)(100 parts) serving as a binder resin and trisdimethyl aminoethyl phenol and toluene (100 parts) were added coated conductive particles [1], and this was sufficiently dispersed and mixed by using a planetary stirring device to prepare a binder resin dispersion matter, and this was then applied onto a releasing film with a fixed thickness so as to form a thickness of 7 μm after drying, and toluene was evaporated so that an adhesive film containing coated conductive particles [1] was obtained. Here, the added amount of the coated conductive particles [1] was set so that the content thereof in an anisotropic conductive film [1] was 200,000 particles/cm².

The adhesive film without containing coated conductive particles was laminated on the resulting adhesive film containing coated conductive particles [1] at room temperature so that an anisotropic conductive film [1] having a thickness of 17 µm, which had a two-layer-structure, was obtained.

Here, one portion of the binder resin dispersion matter containing coated conductive particles [1] was washed with toluene so that coated conductive particles [1] were extracted; thereafter, when the resulting particles were observed under an SEM, no separation of the insulating particles from the coated conductive particles was confirmed.

EXAMPLES 11 TO 18, COMPARATIVE EXAMPLES 7 TO 12

The same processes as example 10 were carried out except that coated conductive particles [2] to [15], obtained in examples 2 to 9 and comparative examples 1 to 6, were respectively used so that anisotropic conductive films [2] to [15] were obtained. The thickness of all the anisotropic conductive films was set to 17 µm, with the content of all the coated conductive particles being set to 200,000 particles/cm².

Here, one portion of the binder resin dispersion matter containing coated conductive particles was washed with toluene so that coated conductive particles were extracted; thereafter, when the resulting particles were observed under an SEM, no separation of the insulating particles from the coated conductive particles was confirmed. However, in the case of coated conductive particles [10], although the laminated structure no longer existed to virtually form a single coated film presumably because the laminated insulating particles were separated therefrom, the coating rate increased from 50% to 70%. This is presumably because the separated insulating particles re-adhered to the surface. Further, in the case of the coated conductive particles [12] and [14], the coating rates decreased from 30% to less than 5% respectively presumably due to coming off during the dispersing process.

With respect to the anisotropic conductive films [1] to [15] obtained in examples 10 to 18 and comparative examples 7 to 12, evaluation was conducted on insulating/conductivity properties and adhesion. The results of evaluation are shown in Table 2.

(Insulating Property Test between Adjacent Electrodes)

Pieces of an anisotropic conductive film, cut into a size of 4×18 mm, were bonded onto a silicon wafer circuit board having a comb-shaped pattern represented in FIG. 1 (number of lines: 400, length of overlapped portions: 2 mm, line width: 20 µm, line interval: 20 µm, line height: 18 µm), and this was sandwiched between flat glass plates having a size of 2×12.5 mm and a thickness of 1 mm, and subjected to thermocompression bonding processes under the following conditions 1 and 2; thereafter, a resistance value between the electrodes was measured and the rate of values of not less than $10^8 \Omega$ was found. The present tests were carried out under n=20.

Condition 1: heating process for 30 minutes at 150° C. under an applied pressure of 20 N.

Condition 2: heating process for 30 seconds at 200° C. under an applied pressure of 200 N.

(Longitudinal Conductivity Tests)

Pieces of an anisotropic conductive film, cut into a size of 5×5 mm, were bonded virtually in the center of one of glass circuit boards (width: 1 cm, length: 2.5 cm) on which ITO electrodes (width: 100 µm, height: 0.2 µm, length: 2 cm) were formed; thereafter, a glass circuit board having the same ITO electrodes was positioned thereon with the mutual electrodes being overlapped with 90 degrees, and bonded to each other. After the joined portions of the glass circuit boards had been thermocompression-bonded under condition 1 and condition 2, the resistance value was measured by using a four-terminal method and the rate of values of not more than $5\Omega$ was found. The present tests were carried out under n=20.

Condition 1: heating process for 30 minutes at 150° C. under an applied pressure of 20 N Condition 2: heating process for 30 seconds at 200° C. under an applied pressure of 200 N.

Moreover, with respect to the anisotropic conductive films [2], [6], [8] and [11], glass circuit boards that had been thermocompression-bonded under condition 1 were left for 300 hours under cycles of 55° C.×6 hours and 120° C.×6 hours; thereafter, the resistance value was measured by using a four-terminal method, and the rate of values of not more than $5\Omega$ was found, and defined as the conductivity after 300 hours.

(Evaluation of Adhesion)

With respect to the anisotropic conductive films [2], [6], [8] and [11], longitudinal conductivity tests were carried out under condition 1, and after these test circuit boards had been further left for 300 hours under cycles of 55° C.×6 hours and 120° C.×6 hours, the cross-section thereof was observed under an SEM for any interface separation between the conductive particles and the insulating particles as well as between the insulating particles and the binder resin.

TABLE 2

| | Coated conductive fine particles | Separation of binder resin upon dispersion | Insulating property test | | Conductivity test | | | Adhesion evaluation | |
|---|---|---|---|---|---|---|---|---|---|
| | | | | | | | | Between metal surface particles and insulating particles | Between insulating particles and binder resin |
| | | | 20 N 150° C. 30 m | 200 N 200° C. 30 s | 20 N 150° C. 30 m | 200 N 200° C. 30 s | After 300 h | | |
| Example 10 | 1 | No | 95% | 90% | 100% | 100% | — | — | — |
| Example 11 | 2 | No | 100% | 95% | 85% | 90% | 90% | No interface separation | No interface separation |
| Example 12 | 3 | No | 100% | 100% | 90% | 100% | — | — | — |
| Example 13 | 4 | No | 90% | 85% | 100% | 100% | — | — | — |

TABLE 2-continued

| | Coated conductive fine particles | Separation of binder resin upon dispersion | Insulating property test 20 N 150° C. 30 m | Insulating property test 200 N 200° C. 30 s | Conductivity test 20 N 150° C. 30 m | Conductivity test 200 N 200° C. 30 s | After 300 h | Adhesion evaluation Between metal surface particles and insulating particles | Adhesion evaluation Between insulating particles and binder resin |
|---|---|---|---|---|---|---|---|---|---|
| Example 14 | 5 | No | 100% | 95% | 100% | 100% | — | — | — |
| Example 15 | 6 | No | 100% | 100% | 100% | 100% | 100% | No interface separation | No interface separation |
| Example 16 | 7 | No | 100% | 100% | 100% | 100% | — | — | — |
| Example 17 | 8 | No | 100% | 100% | 100% | 100% | 100% | Only slight interface separation | Slight interface separation |
| Example 18 | 9 | No | 100% | 100% | 90% | 100% | — | — | — |
| Comparative Example 7 | 10 | Yes (increase in coat density) | 100% | 100% | 70% | 80% | — | — | — |
| Comparative Example 8 | 11 | No | 60% | 60% | 100% | 100% | 50% | Interface separation in some substrates | Interface separation in almost all the substrates |
| Comparative Example 9 | 12 | Yes (decrease in coat density) | 10% | 5% | 100% | 100% | — | — | — |
| Comparative Example 10 | 13 | No | 100% | 100% | 50% | 80% | — | — | — |
| Comparative Example 11 | 14 | Yes (decrease in coat density) | 30% | 10% | 100% | 100% | — | — | — |
| Comparative Example 12 | 15 | No | 100% | 100% | 40% | 60% | — | — | — |

INDUSTRIAL APPLICABILITY

In accordance with the present invention, it becomes possible to provide a coated conductive particle having superior connection reliability, a method for manufacturing such coated conductive particle, an anisotropic conductive material and a conductive-connection structure.

The invention claimed is:

1. A coated conductive particle comprising a particle having a surface made of conductive metal and insulating particles to coat the surface of the particle having the surface made of electrically conductive metal therewith,
   wherein the insulating particles are chemically bonded to the particle having the surface made of electrically conductive metal via a functional group (A) having a bonding property to the electrically conductive metal so that a single coating layer is formed.

2. The coated conductive particle according to claim 1, wherein the particle having the surface made of electrically conductive metal comprises a core particle made from a resin and an electrically conductive metal layer formed on the surface of the core particle.

3. The coated conductive particle according to claim 1, wherein 5 to 50% of the surface area of the particle having the surface made of electrically conductive metal is coated with the insulating particles.

4. The coated conductive particle according to claim 1, wherein the insulating particles have an average particle size of not more than 1/10 of the average particle size of the particle having the surface made of electrically conductive metal.

5. The coated conductive particle according to claim 1, wherein the insulating particles have a CV value of the particle size of not more than 20%.

6. The coated conductive particle according to claim 1, wherein the insulating particles are brought into contact with the surface of the particle having the surface made of electrically conductive metal at not more than 20% of the surface area.

7. The coated conductive particle according to claim 1, wherein the insulating particles are softer than the particle having the surface made of electrically conductive metal.

8. The coated conductive particle according to claim 7, wherein the insulating particles are made from a cross-linking resin.

9. The coated conductive particle according to claim 1, wherein the insulating particles are harder than the particle having the surface made of electrically conductive metal.

10. The coated conductive particle according to claim 1, wherein the insulating particles have a positive charge.

11. The coated conductive particle according to claim 1, wherein the insulating particles are made from a resin having an ammonium group or a sulfonium group.

12. The coated conductive particle according to claim 1, wherein the functional group (A) having a bonding property to metal is a thiol group or a sulfide group.

13. A method for manufacturing the coated conductive particle according to claim 1,
   which comprises at least the steps of:
   a step 1 of allowing insulating particles to aggregate onto the particle having the surface made of electrically conductive metal by a Van der Waals force or an electrostatic interaction in an organic solvent and/or water; and
   a step 2 of chemically bonding the particle having the surface made of electrically conductive metal and the insulating particles to each other.

14. An anisotropic conductive material comprising the coated conductive particle according to claim 1, wherein the coated conductive particle is dispersed in an insulating binder resin.

15. The anisotropic conductive material according to claim 14,
wherein the binder resin is an adhesive being cured by heat and/or light.

16. The anisotropic conductive material according to claim 14,
wherein the functional group belonging to the insulating particles of the coated conductive particle is chemically bonded to the functional group in the binder resin.

17. The anisotropic conductive material according to claim 16,
wherein the functional group belonging to the insulating particles of the coated conductive particle to be chemically bonded to the functional group in the binder resin is an epoxy group.

18. The anisotropic conductive material according to claim 14,
which is an anisotropic conductive adhesive.

19. A conductive-connection structure,
which is conduction-connected by the coated conductive particle according to claim 1.

20. A conductive-connection structure, which is conduction-connected by anisotropic conductive material according to claim 14.

* * * * *

UNITED STATES PATENT AND TRADEMARK OFFICE
CERTIFICATE OF CORRECTION

PATENT NO. : 7,291,393 B2  
APPLICATION NO. : 10/489406  
DATED : November 6, 2007  
INVENTOR(S) : Takeshi Wakiya, Yoshikazu Yoneda and Masako Ueba It is certified that error appears in the above-identified patent and that said Letters Patent is hereby corrected as shown below:

Title Page

Please amend as follows:

(86) § 371 (c)(1), (2), (4) Date: Please delete "Jul. 30, 2005" and insert therefore --Jul. 30, 2004--

Signed and Sealed this

Fifteenth Day of April, 2008

JON W. DUDAS  
*Director of the United States Patent and Trademark Office*